United States Patent
Lin et al.

(10) Patent No.: US 7,024,603 B1
(45) Date of Patent: Apr. 4, 2006

(54) ARRANGEMENT FOR VERIFYING THAT MEMORY EXTERNAL TO A NETWORK SWITCH AND THE MEMORY INTERFACE ARE FREE OF DEFECTS

(75) Inventors: Chong Chang Lin, San Jose, CA (US); Harand Gaspar, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 760 days.

(21) Appl. No.: 09/797,711

(22) Filed: Mar. 5, 2001

(51) Int. Cl.
*G11C 29/00* (2006.01)
(52) U.S. Cl. .................................. 714/720
(58) Field of Classification Search ............... 324/500, 324/536, 539; 714/718–720
See application file for complete search history.

(56) References Cited

U.S. PATENT DOCUMENTS 3,784,910 A * 1/1974 Sylvan .................. 324/500
5,953,335 A * 9/1999 Erimli et al. .......... 370/390
6,295,620 B1 * 9/2001 Togo .................... 714/719

* cited by examiner

*Primary Examiner*—Guy J. Lamarre
(74) *Attorney, Agent, or Firm*—Manelli Denison & Selter PLLC; Leon R. Turkevich; Edward J. Stemberger

(57) ABSTRACT

A method and arrangement is provided for testing memory external to a network switch and a memory interface bus connecting the external memory to the network switch. The method includes writing, via the memory interface bus and on a per-bit basis, a first prescribed logic pattern to a prescribed region of the memory to check for one of a bus short to ground and a short between adjacent pins of the memory. The first prescribed logic pattern is read to verify operation of the prescribed region of the memory. The method includes writing, via the memory interface bus and on a per-bit basis, a second prescribed logic pattern, complementary to the first prescribed logic pattern, to a prescribed region of the memory to check for one of a bus short to power and a short between adjacent pins of the memory. The second prescribed logic pattern is read to verify operation of the prescribed region of the memory.

12 Claims, 2 Drawing Sheets

ARRANGEMENT FOR VERIFYING THAT MEMORY EXTERNAL TO A NETWORK SWITCH AND THE MEMORY INTERFACE ARE FREE OF DEFECTS

BACKGROUND OF THE INVENTION

1. Field of the Invention

The present invention relates to evaluation and testing of network devices such as integrated network switches configured for switching data packets between subnetworks.

2. Background Art

Local area networks use a network cable or other media to link stations on the network. Each local area network architecture uses a media access control (MAC) enabling network interface devices at each network node to access the network medium.

Switched local area networks are encountering increasing demands for higher speed connectivity, more flexible switching performance, and the ability to accommodate more complex network architectures. For example, commonly-assigned U.S. Pat. No. 5,953,335 discloses a network switch configured for switching layer 2 type Ethernet (IEEE 802.3) data packets between different network nodes; a received layer 2 type data packet may include a VLAN (virtual LAN) tagged frame according to IEEE 802.1p (802.1D) protocol that enables the network switch to perform more advanced switching operations. For example, the VLAN tag may specify another subnetwork (via a router) or a prescribed group of stations.

In testing network switches and external devices connected therewith, certain aspects of the overall system should be tested individually to isolate defects that may cause erroneous test results that may erroneously appear as defects in the network switch under test. For example, memory external to a network switch and the memory interface bus should be tested for defects such as shorts and solder opens.

SUMMARY OF THE INVENTION

There is a need for testing memory external to a network switch and the memory interface bus for defects.

These and other needs are attained by the present invention, where a method is provided for testing memory external to a network switch and a memory interface bus connecting the external memory to the network switch. The method includes writing, via the memory interface bus and on a per-bit basis, a first prescribed logic pattern to a prescribed region of the memory to check for one of a bus short to ground and a short between adjacent pins of the memory. The first prescribed logic pattern is read to verify operation of the prescribed region of the memory. The method includes writing, via the memory interface bus and on a per-bit basis, a second prescribed logic pattern, complementary to the first prescribed logic pattern, to the prescribed region of the memory to check for one of a bus short to power and a short between adjacent pins of the memory. The second prescribed logic pattern is read to verify operation of the prescribed region of the memory.

Another aspect of the present invention provides an arrangement for testing memory external to a network switch and a memory interface bus connecting the external memory to the network switch. The arrangement includes a network switch, a central processing unit (CPU) connected to the network switch, memory external to the network switch, and a memory interface bus connecting the external memory to the network switch. The CPU is configured to (1) send instructions across the memory interface bus to the network switch for writing to a prescribed region of the memory on a per-bit basis, a pattern of logic 1s to check for one of a bus short to ground and a short between adjacent pins of the memory, (2) read the pattern of logic 1s to verify operation of the prescribed region of the memory, (3) send instructions across the memory interface bus to the network switch for writing on a per-bit basis, a pattern of logic 0s to the prescribed region of the memory to check for one of a bus short to power and a short between adjacent pins of the memory, and (4) read the pattern of logic 0s to verify operation of the prescribed region of the memory.

Additional advantages and novel features of the invention will be set forth in part in the description which follows and in part will become apparent to those skilled in the art upon explanation of the following or may be learned by practice of the invention. The advantages of the present invention may be realized and attained by means of instrumentalities and combinations particularly pointed in the appended claims.

BRIEF DESCRIPTION OF THE DRAWINGS

Reference is made to the attached drawings, wherein elements having the same reference numeral designations represent like elements throughout and wherein.

BEST MODE FOR CARRYING OUT THE INVENTION

Figure 1:
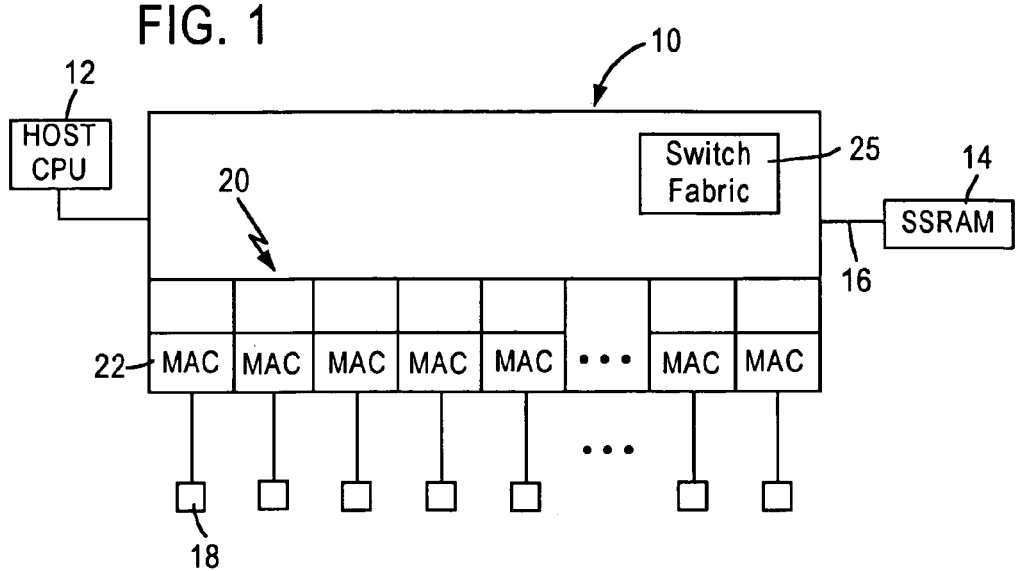
FIG. 1 is a block diagram of a network switch connected with a host CPU and external memory.

FIG. 1 is a block diagram of a network device 10, such as a network switch, connected with a host CPU 12 and external buffer memory 14, such as Synchronous Static Random Access Memory (SSRAM). The memory 14 is connected with the network switch 10 via a memory interface 16 in the form of a 64 bit memory bus. The disclosed network switch, for example, as disclosed in U.S. Pat. No. 5,953,335, has switch ports that include a media access controller (MAC), enabling transmission and reception of layer 2 type data packets between network stations 18. As shown in FIG. 1, the switch 10 includes a switch port 20 that includes a media access control (MAC) module 22 that transmits and receives data packets to associated network stations 18 across 10/100 Mbps physical layer (PHY) transceivers (not shown) according to IEEE 802.3u protocol. The switch 10 also includes a switch fabric 25 configured for making frame forwarding decisions for received data packets. In particular, the switch fabric 25 is configured for layer 2 switching decisions based on source address, destination address, and VLAN information within the Ethernet (IEEE 802.3) header. The switch fabric 25 is also configured for selective layer 3 switching decisions based on evaluation of an IP data packet within the Ethernet packet.

The host CPU 12 controls the overall operations of the switch 10, including programming of the switch fabric 25. The buffer memory 14 is used by the switch 10 to store data frames while the switch fabric 25 is processing forwarding decisions for the received data packets.

Figure 2:
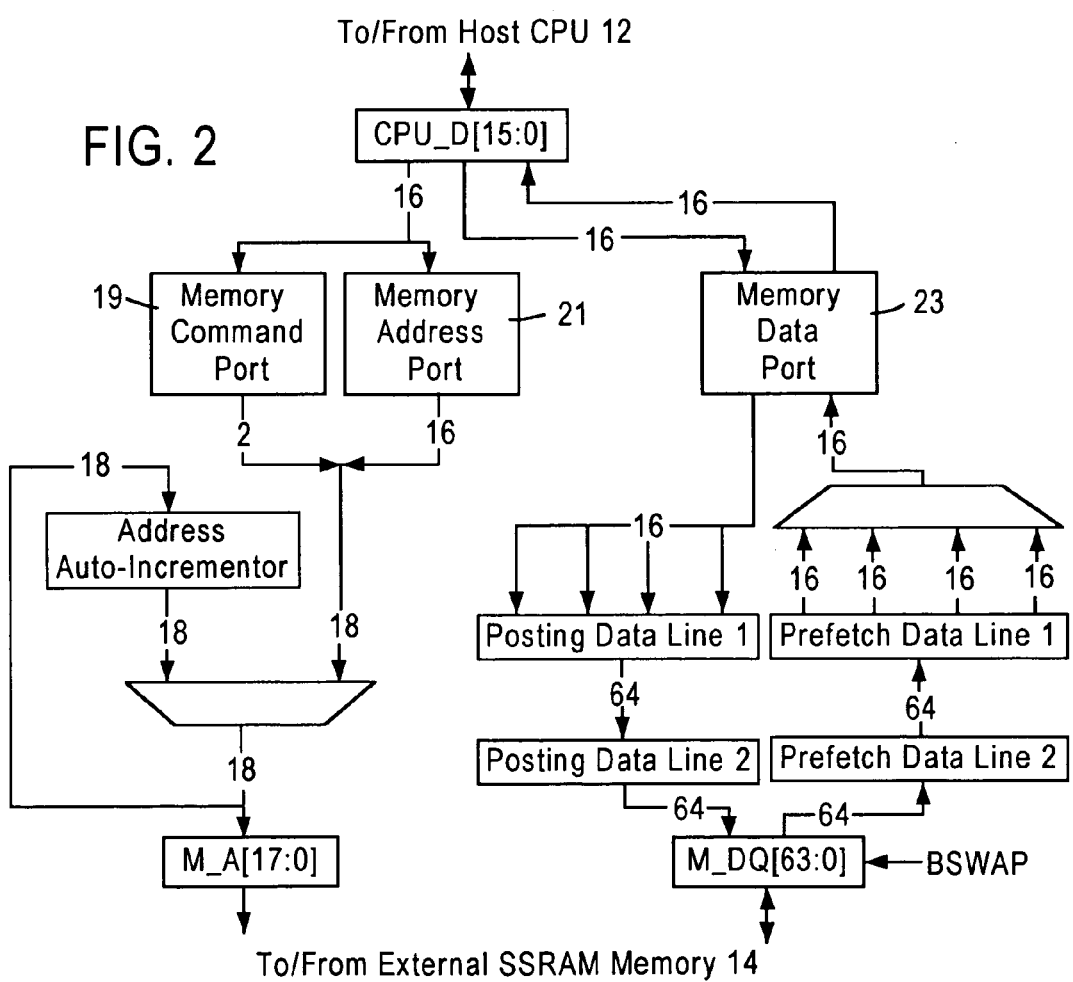
FIG. 2 is a block diagram showing CPU access of the external memory via at the network switch of FIG. 1.

With reference to FIG. 2, the network switch 10 provides the host CPU 12 indirect access to the buffer memory 14 through three registers, the Memory Command Port 19, the Memory Address Port 21 and the Memory Data Port 23. Prefetch and posting registers support the reading from and writing to the buffer memory 14. The interface logic of the buffer memory 14 is designed for block transfers. The host CPU 12 first writes a starting memory address, and then the host CPU 12 executes a series of read or write accesses to the Memory Data Port 23 to transfer a block of data. An internal memory address pointer increments automatically. Accesses are coordinated through the Memory Command Port 19.

Figure 3:
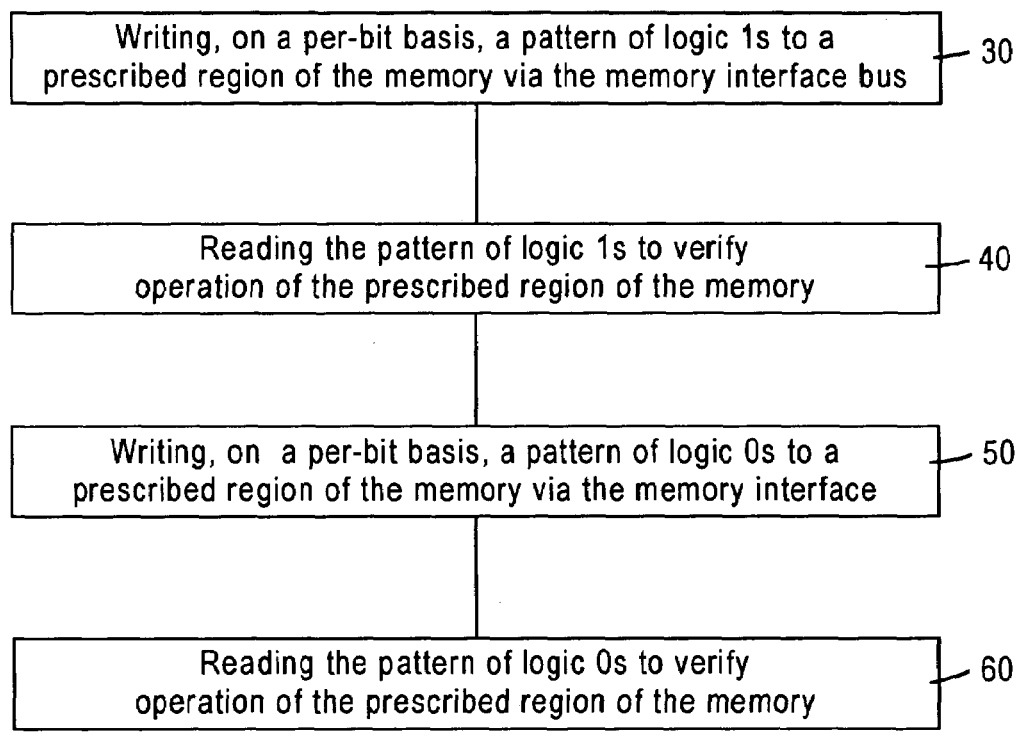
FIG. 3 is a flow diagram of the steps of testing the external memory and memory interface of the FIG. 1.

FIG. 3 is a diagram illustrating a method, implemented by the CPU executing a test routine, in order to test the memory 14 and memory interface 16 for defects such as shorts, open solders etc. Thus, in step 30, the method includes writing a first prescribed pattern such as logic 1s to a prescribed region of the memory interface 16 to check for a bus short to ground or to adjacent pins of the memory 14. This first pattern is typically referred to as "walking 1s". Thus, on a per-bit basis, each wire is driven with a logic 1 and all other wires are driven with logic 0. In step 40, the first pattern is then read by the CPU 12 to verify operation of the region of the memory 14. Thereafter, in step 50, the method includes writing a second prescribed pattern, complementary to the first pattern (i.e., 1s complement) to the memory interface 16 to check for a bus short to power or to adjacent pins of the memory 14. Thus, on a per-bit basis, each wire is driven with a logic 0 and all other wire are driven with a logic 1. This second pattern is typically referred to as "walking 0s". The second pattern is then read by the CPU 12 in step 60 to verify operation of the region of the memory 14. Optionally, after step 60, the method can include writing a third prescribed pattern of 1s and 0s, such as an eight bit pattern (i.e., 11110000), to the memory 14 to test the entire external memory array. The third pattern is then read by the CPU 12 to verify operation of the memory array 14. The third pattern is considered a "marching" pattern.

The CPU 12 uses assembly language coding to optimize execution speed of the test routine. Thus, the CPU 12 includes programmed instructions for performing the step of walking 1s, walking 0s, and sending the marching pattern to the memory 14.

Hence, an effective way of testing memory and a memory interface for shorts and solder opens is provided.

While this invention has been described with what is presently considered to be the most practical preferred embodiment, it is to be understood that the invention is not limited to the disclosed embodiments, but, on the contrary, is intended to cover various modifications and equivalent arrangements included within the spirit and scope of the appended claims.

What is claimed is:

1. A method of testing memory external to a network switch and a memory interface bus connecting the external memory to the network switch, the method including:
    writing, via the memory interface bus and on a per-bit basis, a first prescribed logic pattern to a prescribed region of the memory to check for one of a bus short to ground and a short between adjacent pins of the memory,
    reading the first prescribed logic pattern to verify operation of the prescribed region of the memory,
    writing, via the memory interface bus and on a per-bit basis, a second prescribed logic pattern, complementary to the first prescribed logic pattern, to the prescribed region of the memory to check for one of a bus short to power and a short between adjacent pins of the memory, and
    reading the second prescribed logic pattern to verify operation of the prescribed region of the memory.

2. The method of claim 1, wherein the memory interface bus is a 64 bit bus.

3. The method of claim 1, wherein a central processing unit (CPU) is connected to the network device, the method including sending instructions from the CPU to the network switch for performing the writing steps, and receiving instructions from the network switch for performing the reading steps.

4. The method of claim 1, wherein the memory is SSRAM.

5. The method of claim 1, wherein the first prescribed logic pattern is a pattern of 1s and the second prescribed logic pattern is a pattern of 0s.

6. The method of claim 1, further including:
    writing a third pattern of logic 1s and 0s to the entire memory via the memory interface, and reading the third pattern to verify operation of the entire memory array.

7. The method of claim 6, wherein the third prescribed pattern is eight bits.

8. An arrangement for testing memory external to a network switch and a memory interface bus connecting the external memory to the network switch, the arrangement comprising:
    a network switch,
    a central processing unit (CPU) connected to the network switch,
    memory external to the network switch, and
    a memory interface bus connecting the external memory to the network switch,
    the CPU being configured to:
        send instructions across the memory interface bus to the network switch for writing to a prescribed region of the memory on a per-bit basis, a pattern of logic 1s to check for one of a bus short to ground and a short between adjacent pins of the memory,
        read the pattern of logic 1s to verify operation of the prescribed region of the memory,
        send instructions across the memory interface bus to the network switch for writing on a per-bit basis, a pattern of logic 0s to the prescribed region of the memory to check for one of a bus short to power and a short between adjacent pins of the memory, and
        read the pattern of logic 0s to verify operation of the prescribed region of the memory.

9. The arrangement of claim 8, wherein the memory interface bus is a 64 bit bus.

10. The arrangement of claim 8, wherein the memory is SSRAM.

11. The arrangement of claim 8, wherein the CPU is further configured to:
    write a prescribed pattern of logic 1s and 0s to the entire memory via the memory interface, and
    read the prescribed pattern of 1s and 0s to verify operation of the entire memory array.

12. The arrangement of claim 11, wherein the prescribed pattern of 1s and 0s is eight bits.

* * * * *